United States Patent
Moon et al.

(10) Patent No.: US 8,946,759 B2
(45) Date of Patent: Feb. 3, 2015

(54) ORGANIC LIGHT EMITTING DISPLAY DEVICE WITH IMPROVED SEALING PROPERTY

(75) Inventors: Jung Woo Moon, Suwon-si (KR); Hyun Joon Oh, Seongnam-si (KR)

(73) Assignee: Samsung-Display Co., Ltd., Yongin-si (KR)

( * ) Notice: Subject to any disclaimer, the term of this patent is extended or adjusted under 35 U.S.C. 154(b) by 0 days.

(21) Appl. No.: 13/612,734

(22) Filed: Sep. 12, 2012

(65) Prior Publication Data
US 2013/0292649 A1  Nov. 7, 2013

(30) Foreign Application Priority Data
May 3, 2012 (KR) .................. 10-2012-0046672

(51) Int. Cl.
*H01L 33/00* (2010.01)
(52) U.S. Cl.
USPC .............. 257/99; 257/40; 257/81; 257/789; 257/E23.116; 438/99; 438/27; 438/28
(58) Field of Classification Search
USPC ............ 257/40, 99, 100, 81, 433, 787–790, 257/795, E23.116, E21.502, E23.121, 257/E23.126, E23.136, E21.499; 349/153; 438/99, 127, 26–28
See application file for complete search history.

(56) References Cited

U.S. PATENT DOCUMENTS

| | | | | |
|---|---|---|---|---|
| 4,042,550 A | * | 8/1977 | Tuller et al. | 523/434 |
| 6,376,915 B1 | * | 4/2002 | Hikita et al. | 257/777 |
| 2002/0020924 A1 | * | 2/2002 | Mueller et al. | 257/778 |
| 2007/0177069 A1 | * | 8/2007 | Lee | 349/56 |
| 2008/0173698 A1 | * | 7/2008 | Marczi et al. | 228/180.1 |
| 2010/0012966 A1 | * | 1/2010 | Choi et al. | 257/99 |

FOREIGN PATENT DOCUMENTS

| | | |
|---|---|---|
| KR | 10-2007-0033228 | 3/2007 |
| KR | 10-2007-0088699 A | 8/2007 |
| KR | 10-2009-0110132 A | 10/2009 |
| KR | 10-2011-0065858 A | 6/2011 |

* cited by examiner

*Primary Examiner* — Samuel Gebremariam
*Assistant Examiner* — Lauren R Bell
(74) *Attorney, Agent, or Firm* — Christie, Parker & Hale, LLP (57) ABSTRACT

Disclosed is an organic light emitting display device which prevents or inhibits external gas, such as, oxygen or moisture, from penetrating into a display unit and reinforces a mechanical strength by providing a first sealant and a second sealant. The organic light emitting display device may include: a first substrate; a display unit on the first substrate; a second substrate covering the display unit; a first sealant adhering the first substrate to the second substrate; and a second sealant around the first sealant, the second sealant sealing the first substrate and the second substrate. A filler may be included in the second sealant, and a particle size of the filler may be larger than a gap between the first substrate and the second substrate.

17 Claims, 6 Drawing Sheets

FIG. 1

Related Art

ORGANIC LIGHT EMITTING DISPLAY DEVICE WITH IMPROVED SEALING PROPERTY

CROSS-REFERENCE TO RELATED APPLICATIONS

This application claims priority to and the benefit of Korean Patent Application No. 10-2012-0046672, filed on May 3, 2012, with the Korean Intellectual Property Office, the entire content of which is incorporated herein by reference.

BACKGROUND

1. Field

Aspects of the present invention relate generally to an organic light emitting display device.

2. Description of Related Art

Recently, thin type flat panel display devices which can implement high resolution and have a thin thickness have been developed. Among the flat panel display devices, an electroluminescence display device, as a self-emission display device, has received attention as a next-generation display device due to a wide viewing angle, an excellent contrast, and a fast response speed.

An organic light emitting display device, in which a material for forming an emission layer includes an organic material, is presently being commercialized due to its excellent luminance, driving voltage, and response speed as well as because it is a polychrome. Accordingly, research and development thereof are continuing.

Figure 1:
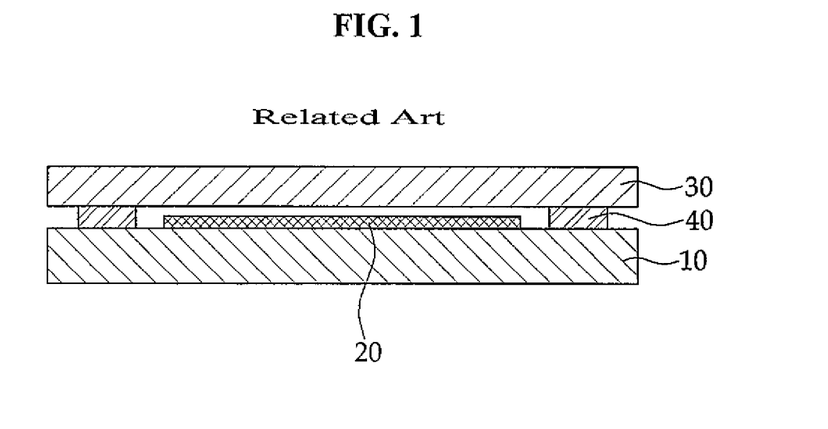
FIG. 1 is a cross-sectional view schematically illustrating an organic light emitting display device.

FIG. 1 is a cross-sectional view schematically illustrating an organic light emitting display device. The organic light emitting display device illustrated in FIG. 1 includes a display unit 20 on a first substrate 10, and a second substrate 30 disposed above the display unit 20. Pixels, which include an emission layer, are formed at the display unit 20 to serve as a display element. Further, the first substrate 10 and the second substrate 30 are adhered to each other by a sealant 40.

With the organic light emitting display device, deterioration due to internal factors, such as deterioration of the emission layer due to oxygen derived from transparent conductive oxide (TCO) and the like (which is used for forming an electrode of the display unit 20) and due to a reaction on an interface between the emission layer and another layer may occur. In addition, deterioration due to moisture, oxygen, and ultraviolet light introduced from the outside and due to external factors generated in a manufacturing process of an apparatus may occur. In particular, since external oxygen and moisture have a serious influence on devices, sealing and packaging are important, for example, while manufacturing the organic light emitting display device.

However, when the first substrate 10 and the second substrate 30 are adhered to each other by the sealant 40, gas, such as, external oxygen or moisture, may penetrate inside through an interface between the sealant 40 and the first substrate 10 or an interface between the sealant 40 and the second substrate 30, and as a result, the display unit 20 may be damaged. Further, the sealant 40 part may be easily broken due to, for example impact.

SUMMARY

Aspects of the present invention provide for an organic light emitting display device directed toward preventing (or inhibiting) an external gas, such as, oxygen or moisture, from penetrating the device and toward reinforcing impact resistance.

An embodiment of the present invention provides an organic light emitting display device including: a first substrate; a display unit on the first substrate; a second substrate covering the display unit; a first sealant adhering the first substrate to the second substrate; and a second sealant around the first sealant, the second sealant sealing a gap between the first substrate and the second substrate, in which the second sealant includes a filler, and a particle size of the filler is larger than the gap between the first substrate and the second substrate.

A ratio of the particle size of the filler to the gap may be from about 1.2 to about 5.0.

The filler may be around the gap to block oxygen or moisture from entering the gap.

The filler may include particles having any one of round, plate, or cylindrical shapes.

The first sealant may be inside an edge of the first substrate or the second substrate and may border the edge between the first substrate and the second substrate.

The second sealant may extend toward an outside of at least one of the first substrate or the second substrate.

In an embodiment, the second substrate is smaller than the first substrate, the first sealant is inside an edge of the second substrate, and borders the edge between the first substrate and the second substrate, and the second sealant is around the first sealant and extends toward an outside of the second substrate. The second sealant may cover at least a portion of a top surface of the second substrate that faces away from and is parallel to a surface of the first substrate that the display unit is on.

In an embodiment, the first substrate is smaller than the second substrate, the first sealant is inside an edge of the first substrate and borders the edge between the first substrate and the second substrate, and the second sealant is around the first sealant and extends toward the outside of the first substrate.

A thin film transistor may be on the first substrate. The second substrate may include an encapsulation substrate.

At least one of the first substrate and the second substrate may include a glass substrate.

The filler may be from about 50 wt % (i.e., percent by weight) to about 90 wt % (i.e., percent by weight) of the second sealant, with respect to an entire weight of the second sealant.

The first sealant may include another filler.

Further, another exemplary embodiment of the present invention provides a method of manufacturing an organic light emitting display device. The method of manufacturing the organic light emitting display device according to the another exemplary embodiment includes: preparing a first substrate; forming a display unit including an emission layer on the first substrate; adhering the first substrate and a second substrate to each other with a first sealant, such that the second substrate covers the display unit; and sealing the first substrate and the second substrate by disposing a second sealant around the first sealant. In this case, the second sealant includes a filler, and a particle size of the filler is larger than a gap between the first substrate and the second substrate.

The method may further include scribing at least one of the first substrate or the second substrate before sealing the first substrate and the second substrate. Here, the second sealant may be disposed after adhering the first substrate and the second substrate to each other with the first sealant.

The first sealant may be disposed inside an edge of the first substrate or the second substrate between the first substrate and the second substrate, and the second sealant may be disposed to extend toward the outside of at least one of the first substrate or the second substrate.

According to aspects of the present invention, it is possible to prevent deterioration, extend lifespan, and reinforce impact resistance of devices, by preventing external gas, such as, oxygen or moisture, or impurities from being penetrated into the display unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Hereinafter, aspects of the present invention will be described in detail with reference to the accompanying drawings and exemplary embodiments. As those skilled in the art would realize, the described embodiments of the present invention may be modified in various different ways, all without departing from the spirit or scope of the present invention.

The accompanying drawings are prepared in order to help with the understanding of the present invention. Shapes of components illustrated in the drawings may be different from actual shapes, and positions thereof may also be different. Further, in order to further understanding, the components in the drawings may be exaggeratedly drawn or illustrated expansively or contractively. That is, respective components and shapes thereof may be schematically drawn or exaggeratedly drawn in the accompanying drawings for easy understanding. Accordingly, the drawings and description are to be regarded as illustrative in nature and not restrictive.

Components that perform the same or similar functions are represented by the same (or like) reference numerals on the drawings. In addition, when an element is referred to as being "on" another element, it may be directly on the another element or may be indirectly on the another element with one or more intervening elements interposed therebetween. Also, when an element is referred to as being "coupled to" (e.g., electrically coupled or connected to) another element, it may be directly coupled to the another element or may be indirectly coupled to the another element with one or more intervening elements interposed therebetween.

Figure 2:
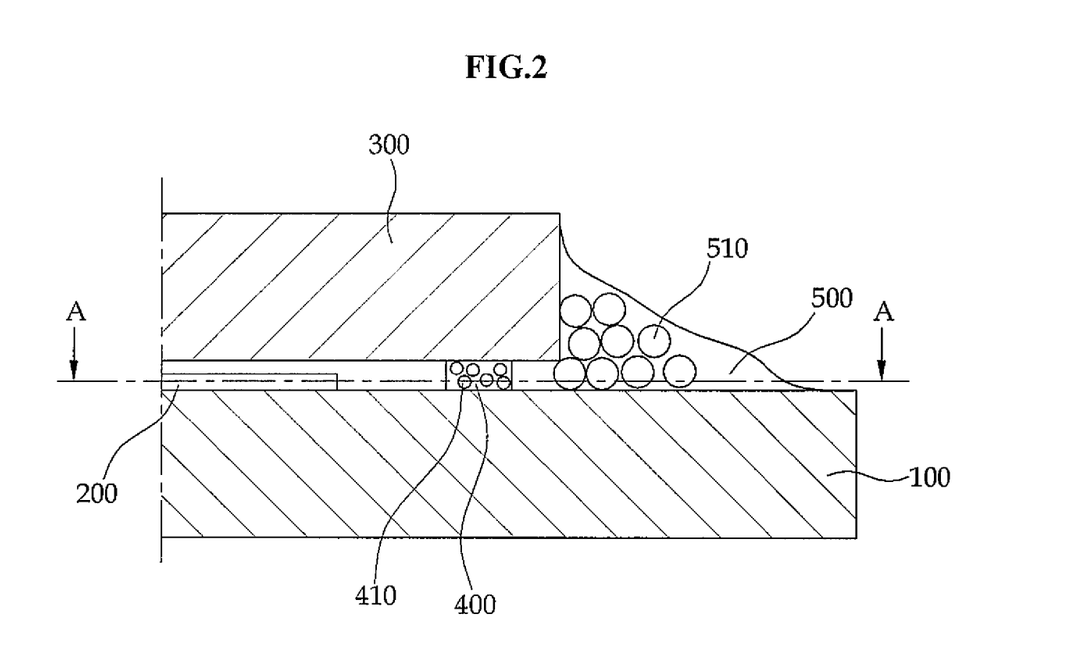
FIG. 2 is a partial cross-sectional view conceptually illustrating a sealing structure of an organic light emitting display device according to an exemplary embodiment of the present invention.
Figure 3:
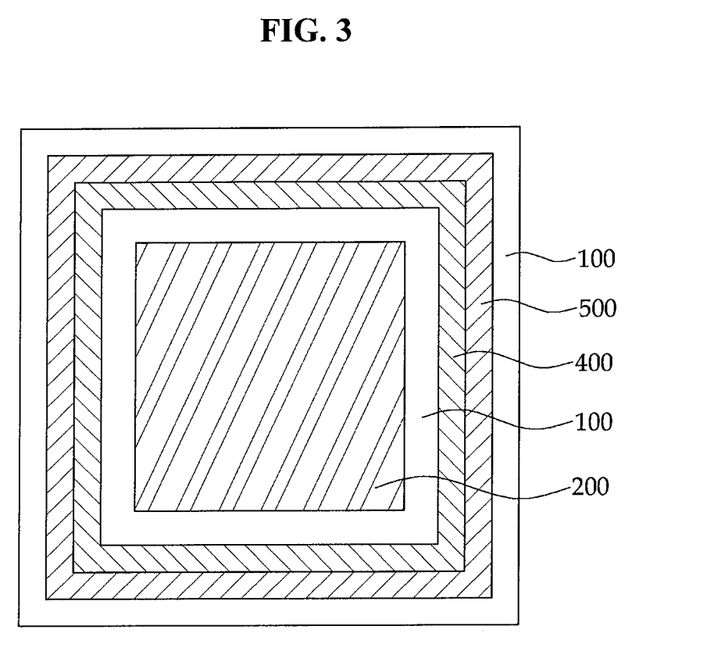
FIG. 3 is a cross-sectional view along the line A-A of FIG. 2, schematically illustrating a cross-section in which a second substrate is not shown in the organic light emitting display device according to the exemplary embodiment of the present invention shown in FIG. 2.

FIG. 2 is a partial cross-sectional view conceptually illustrating a sealing structure of an organic light emitting display device according to an exemplary embodiment of the present invention, and FIG. 3 is a view of a top of a plane along the line A-A of FIG. 2, schematically illustrating a plane in which a second substrate is not shown in the organic light emitting display device according to the exemplary embodiment of the present invention shown in FIG. 2. That is, FIG. 3 illustrates a structure when viewed from a top of a plane, the plane being through the display unit 200 between the first substrate 100 and the second substrate 300 and parallel to a top surface of the first substrate 100 and a bottom surface of the second substrate 300 illustrated in FIG. 2, in which a second substrate 300 illustrated in FIG. 2 is not shown.

The organic light emitting display device according to the exemplary embodiment of the present invention illustrated in FIGS. 2 and 3 includes a first substrate 100, a display unit 200 disposed on the first substrate 100, a second substrate 300 disposed above (e.g., covering) the display unit 200, a first sealant 400 adhering the first substrate 100 and the second substrate 300 to each other, and a second sealant 500 disposed outside (e.g., around) the first sealant 400 to seal the first substrate 100 and the second substrate 300 to each other.

First, the first substrate 100 may include (e.g., be made of) a transparent glass, for example, a transparent glass containing silicon dioxide ($SiO_2$) as a main constituent. The material of the first substrate 100 is not necessarily limited thereto, and the first substrate 100 may also include, for example, a transparent plastic. The transparent plastic applied to the first substrate 100 may have an insulating property. Examples of the transparent plastic include polyethersulphone (PES), polyacrylate (PAR), polyetherimide (PEI), polyethylene naphthalate (PEN), polyethyeleneterephthalate (PET), polyphenylene sulfide (PPS), polyallylate, polyimide, polycarbonate (PC), cellulose triacetate (TAC), cellulose acetate propionate (CAP), and the like.

In the case of a bottom emission type organic light emitting display device, in which light generated from the display unit 200 propagates in a direction of the first substrate 100, the first substrate 100 includes a light transmission material. In the case of a top emission type organic light emitting display device, in which light generated from the display unit 200 propagates in an opposite direction to the first substrate 100, that is, in a direction of the second substrate 300, the first substrate 100 does not necessarily include the light transmission material. In this case, the first substrate 100 may also include a metal. Examples of the metal that may be included in the first substrate 100 include iron, chromium, manganese, nickel, titanium, molybdenum, stainless steel (SUS), an Invar alloy, an Inconel alloy, a Kovar alloy, and the like, but the kind thereof is not limited thereto. In this case, the first substrate 100 may also include a metal foil.

Although not illustrated in the drawings, a buffer layer (not illustrated) for providing smoothness of the first substrate 100 and preventing penetration of impure elements may be further provided on an upper surface of the first substrate 100.

The display unit 200 may be on the first substrate 100. Organic light emitting pixel units 230 are included in the display unit 200. Each of the organic light emitting pixel units 230 includes a pixel electrode 231, an opposed electrode 235, and an emission layer 233 (see, e.g., FIG. 8).

As described above, the first substrate 100 having the display unit 200 thereon is adhered to the second substrate 300, which is disposed above the display unit 200.

The second substrate 300 may also include a glass or a plastic material. In detail, all the materials used for forming the first substrate 100 may also be used for forming the second substrate 300. The first substrate 100 and the second substrate 300 may be made of the same material, or may be made of different materials.

The first substrate 100 and the second substrate 300 are adhered to each other by the first sealant 400. The first sealant 400 may include a sealant which is used in order to adhere two substrates to each other. As an example of the first sealant 400, a glass frit may be used. A filler 410 may be included in the first sealant 400.

As an example of using the glass frit as the first sealant 400, in order to form the first sealant 400, first, a glass frit paste may be prepared. The glass frit paste may include a glass powder, which is a solid, a filler 410, a vehicle, a solvent, and the like. The glass powder may be a powder obtained by finely grinding glass having generally four or more compound compositions. When a gap between the first substrate 100 and the second substrate 300 is $t_{1-2}$, dry milling may be performed so that a particle diameter of the glass powder is within about 20% of the $t_{1-2}$. In an embodiment, when the $t_{1-2}$ is in the range of about 3 to about 50 μm, an average particle diameter of the glass powder may be in the range of about 0.6 to about 10 μm.

The first substrate 100 and the second substrate 300 used in the organic light emitting display device may include materials having a low coefficient of thermal expansion (C.T.E) in order to maintain pattern precision before and after a heat process, and the glass powder used in the glass frit paste may have a coefficient of thermal expansion similar to the first substrate 100 and/or the second substrate 300.

Additionally, in the adhering process using the first sealant 400, the first substrate 100 and the second substrate 300 may be adhered to each other by locally melting the first sealant 400. The first sealant 400 may be melted at a low temperature and may flow satisfactorily after melting so as to form a strong mechanical coupling between the first substrate 100 and the second substrate 300. To this end, the first sealant 400 may have a physically high C.T.E and may have a low impact resistance due to a weak coupling force between molecules.

In order to compensate for the low impact resistance and the high C.T.E, a filler 410 including (e.g., made of), for example, ceramics and the like may be included with (e.g., added into) the glass powder when forming the glass frit paste. Basically, any material which has a C.T.E smaller than the C.T.E of the glass powder may be used as the filler 410, but a filler having a negative C.T.E may be selected and used in order to implement structural stability and a low C.T.E.

However, as described above, although the first substrate 100 and the second substrate 300 are adhered to each other by the first sealant 400, external moisture or oxygen may not be completely prevented from penetrating the display device (e.g., coming into contact with the display unit) by the first sealant 400. Here, in the case where the first substrate 100 and the second substrate 300 are adhered to each other by the first sealant 400, oxygen, moisture, or the like, which enter into an internal portion of the display device from the outside, may damage the display unit 200.

The external oxygen or moisture may penetrate inside the organic light emitting display device through an interface between the first sealant 400 and the first substrate 100 and/or an interface between the first sealant 400 and the second substrate 300, and may also penetrate inside through the first sealant 400 itself.

Figure 4:
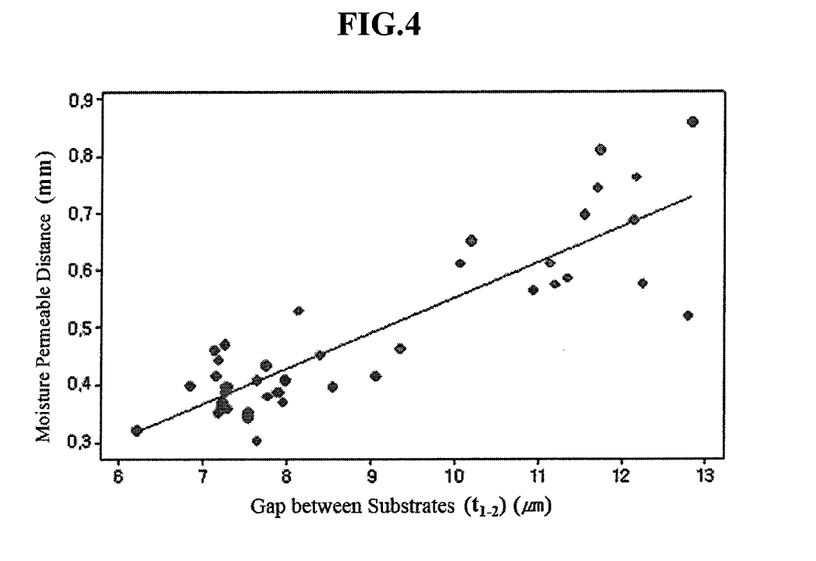
FIG. 4 is a graph illustrating a relationship between a gap between a first substrate and a second substrate and a moisture permeable distance.

In an experimental graph illustrated in FIG. 4, a thickness of the first sealant 400, that is, a gap between the substrates ($t_{1-2}$), and a moisture permeable distance are shown. In detail, the graph illustrated in FIG. 4 is an experimental graph of the moisture permeable distance to a thickness of the first sealant 400 under a condition of humidity of 85% and a temperature of 85° C. when both the first substrate 100 and the second substrate 300 are glass substrates. In FIG. 4, the moisture permeable distance is decreased as the thickness of the first sealant 400 (i.e., the gap between the substrates) is decreased. Accordingly, a storage lifespan of the organic light emitting display device may be improved as the gap between the substrates is decreased. However, the gap between the substrates cannot be unlimitedly decreased due to the structure of the organic light emitting display device. Therefore, in embodiments of the present invention, by applying a second sealant and applying a second filler to the second sealant, a path into which external gas, such as, moisture or oxygen, flows between the substrates is reduced, thereby preventing (or inhibiting) the introduction of the external gas into the interior of the display device.

To this end, in embodiments of the present invention, a second sealant 500 is disposed outside the first sealant 400 to additionally seal the first substrate 100 and the second substrate 300. As shown in FIG. 2, a second filler 510 is included in the second sealant 500. A particle size of the second filler 510 may be larger than the gap between the first substrate 100 and the second substrate 300. The second filler 510 serves as a barrier which blocks the gap between the first substrate 100 and the second substrate 300 to interrupt a path into which external gas, such as, moisture or oxygen, would otherwise flow. That is, the second filler 510 is disposed outside the gap between the first substrate and the second substrate to block the gap.

In some embodiments, in the case where the particle size of the second filler 510 is small, the gap between the first substrate 100 and the second substrate 300 may not be sufficiently blocked, and in the case where the particle size of the second filler 510 is excessively large, it may be difficult to form the second sealant 500. Accordingly, in some embodiments of the present invention, in order to suitably act as the barrier, the particle size of the second filler 510 is in the range of about 1.1 to about 5.0 times the height of the gap $t_{1-2}$ between the first substrate 100 and the second substrate 300.

Figure 5:
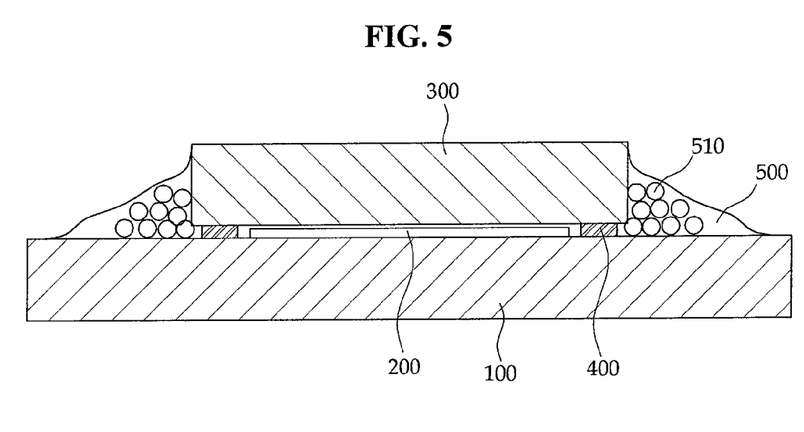
FIG. 5 is a cross-sectional view schematically illustrating an organic light emitting display device according to the exemplary embodiment of the present invention shown in FIG. 2.
Figure 6:
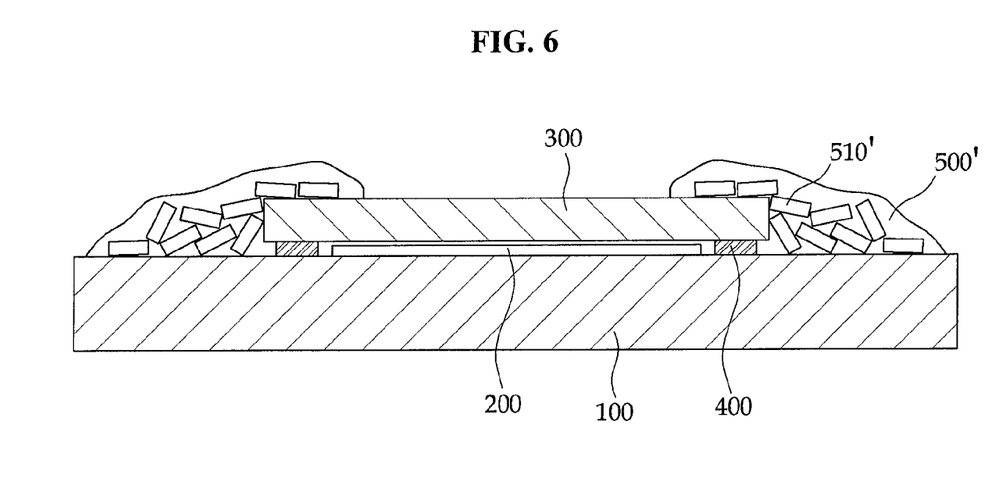
FIG. 6 is a cross-sectional view schematically illustrating an organic light emitting display device according to another exemplary embodiment of the present invention.

In the organic light emitting display device illustrated in FIGS. 5 and 6, examples where the second sealant 500 or 500' and the second filler 510 or 510' are disposed are shown.

Figure 7A:
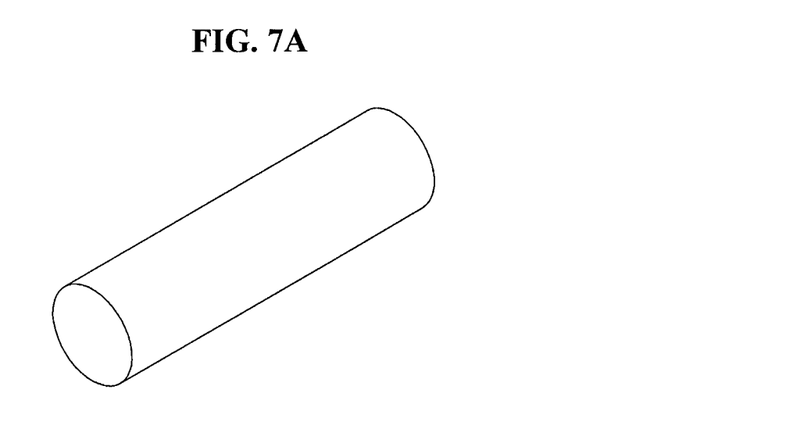
FIGS. 7A to 7C are diagrams illustrating examples of second fillers.
Figure 7B:
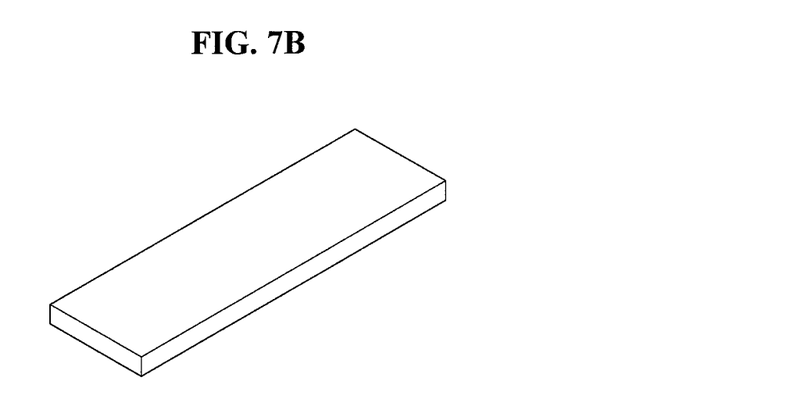
Figure 7C:
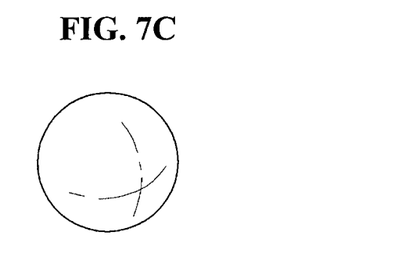

The second filler may have various shapes, (e.g., as comparatively shown by the second filler 500 and 500') for example, the second filler may include any one of round, plate, or cylindrical shapes. That is, the second filler may include particles having, for example, any one of round, plate, or cylindrical shapes. In FIGS. 7A to 7C, examples of the shape of the second filler are shown. That is, FIG. 7A illustrates an example of a second filler having a cylindrical shape, FIG. 7B illustrates an example of a second filler having a plate shape, and FIG. 7C illustrates an example of a second filler having a round (e.g., spherical) shape.

As illustrated in FIGS. 5 and 6, the first sealant 400 is disposed inside an edge (e.g., an edge of the first substrate or the second substrate), and around (e.g., borders) the edge between the first substrate 100 and the second substrate 300 (i.e., the first sealant is located between the first substrate 100 and the second substrate 300), and, as illustrated herein, the second sealant 500 or 500' is disposed to extend toward the outside of the second substrate 300 (but may be disposed to extend toward the outside of at least one of the first substrate 100 or the substrate 300). In the case where the sealants are disposed as described above, the second filler 510 or 510' serves as a barrier to effectively prevent (or inhibit) the external oxygen or moisture from flowing into the organic light emitting display device. As a result, deterioration of the display unit 200 may be prevented or suppressed.

That is, in the embodiments illustrated in FIGS. 5 and 6, the second substrate 300 is smaller than the first substrate 100, the first sealant 400 is disposed inside the edge of the second substrate 300 and around the edge (e.g., periphery) between the first substrate 100 and the second substrate 300, and the second sealant 500 or 500' is disposed outside the first sealant 400 to extend toward the outside of the second substrate 300. Additionally, as in the another exemplary embodiment illustrated in FIG. 6, the second sealant 500' may be disposed to cover not only sides of the second substrate 300, may also cover at least a portion of a top surface of the second substrate 300.

Figure 9:
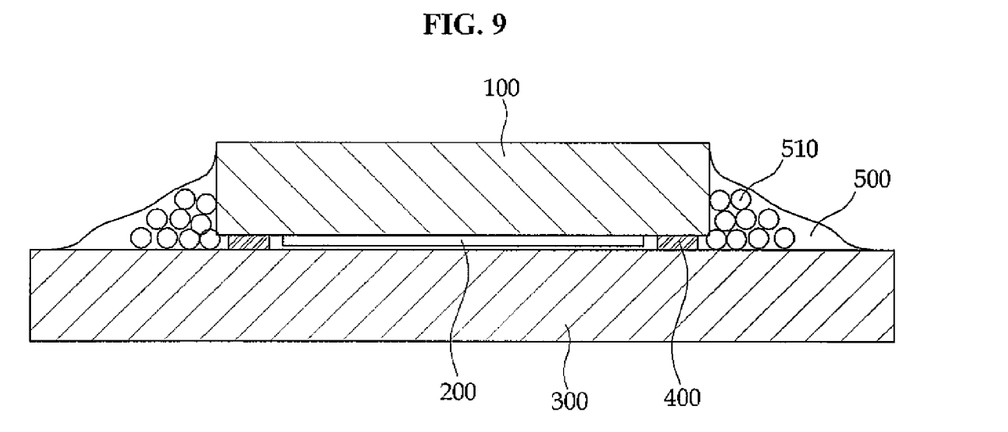
FIG. 9 is a cross-sectional view schematically illustrating an organic light emitting display device according to another embodiment of the present invention.

However, as shown in FIG. 9, the first substrate 100 may be smaller than the second substrate 300, the first sealant 400 may be disposed inside an edge of the first substrate 100 and around the edge (e.g., the periphery) between the first substrate 100 and the second substrate 300, and the second sealant 500 or 500' may be disposed outside the first sealant 400 to extend toward the outside of the first substrate 100.

A thin film transistor may be formed on the first substrate 100, and the second substrate 300 may be an encapsulation substrate. Additionally, a thin film transistor may be formed on the second substrate 300, and the first substrate 100 may also be an encapsulation substrate; and, in this case, the display unit 200 may be provided on the second substrate 300.

At least one of the first substrate 100 or the second substrate 300 may be formed as a glass substrate. However, embodiments of the present invention are not limited thereto and, for example, both the first substrate 100 and the second substrate 300 may be formed as glass substrates, both the first substrate and the second substrate may be formed as plastic substrates, and any one of the first substrate 100 or the second substrate 300 may be formed as a glass substrate and the other one may be formed as a plastic substrate.

A sealant used for adhering the first substrate 100 and the second substrate 300 may be applied as a base medium of the second sealant 500. As an example of the base medium of the second sealant 500, the glass frit may also be applied and/or a polymer resin sealant may also be applied. The second filler 510 may be added to the base medium of the of the second sealant 500 to form the second sealant 500.

As an example of applying a polymer resin to the second sealant 500, in order to form the second sealant 500, first, a resin paste may be prepared. The resin paste may include a resin, the second filler 510, a vehicle, and a solvent. After a resin paste having a suitable viscosity is manufactured, the second sealant 500 may be formed by coating and curing the resin paste outside the first sealant 400 disposed between the first substrate and the second substrate.

In some embodiments, the gap $t_{1-2}$ between the first substrate 100 and the second substrate 300 may be in the range of about 3 μm to about 50 μm, and an average particle diameter of the second filler 510 may be in the range of about 5 μm to about 250 μm.

The content of the second filler 510 included in the second sealant is not particularly limited, but the content of the second filler 510 may be controlled in consideration of availability and durability for forming the second sealant 500. For example, the content of the second filler 510 included in the second sealant 500 may be from about 50 wt % (i.e., percent by weight) to about 90 wt % (i.e., percent by weight) with respect to the entire weight of the second sealant 500.

An auxiliary filler for improving a physical property of the second sealant 500 may be further included in the second sealant 500. For example, an auxiliary filler for controlling a coefficient of thermal expansion (C.T.E) and/or an auxiliary filler for reinforcing an impact strength may be further included.

As described above, since the second sealant 500 is introduced to the organic light emitting display device, and the second filler 510 having, for example, a larger particle size than the gap between the first substrate and the second substrate is included in the second sealant 500, external gas, such as, moisture or oxygen, does not penetrate inside the organic light emitting display device, thereby preventing (or inhibiting) the display unit 200 from being damaged. Further, impact resistance of the organic light emitting display device may be reinforced due to introduction of the second sealant 500.

The organic light emitting display device according to embodiments of the present invention may be manufactured by a method including: preparing the first substrate 100; forming the display unit 200, including an emission layer, on the first substrate 100; adhering the first substrate 100 and a second substrate 300 disposed above the display unit 200 by using the first sealant 400; and sealing the first substrate 100 and the second substrate 300, where a second sealant 500 is disposed outside the first sealant 400. In an embodiment, the second filler 510 is included in the second sealant 500, and a particle size of the second filler 510 is larger than the gap between the first substrate and the second substrate.

The method may further include scribing at least one of the first substrate 100 and the second substrate 300 before sealing the first substrate 100 and the second substrate 300 (which may be a post-processing operation). Additionally, the second sealant 500 may be disposed after first adhering the first substrate 100 and the second substrate 300 by using the first sealant 400.

The first sealant 400 may be disposed inside the edge (e.g., the edge of the first substrate or the second substrate) between the first substrate 100 and the second substrate 300, and the second sealant 500 may be disposed to extend toward the outside of at least one of the first substrate 100 and the second substrate 300.

Figure 8:
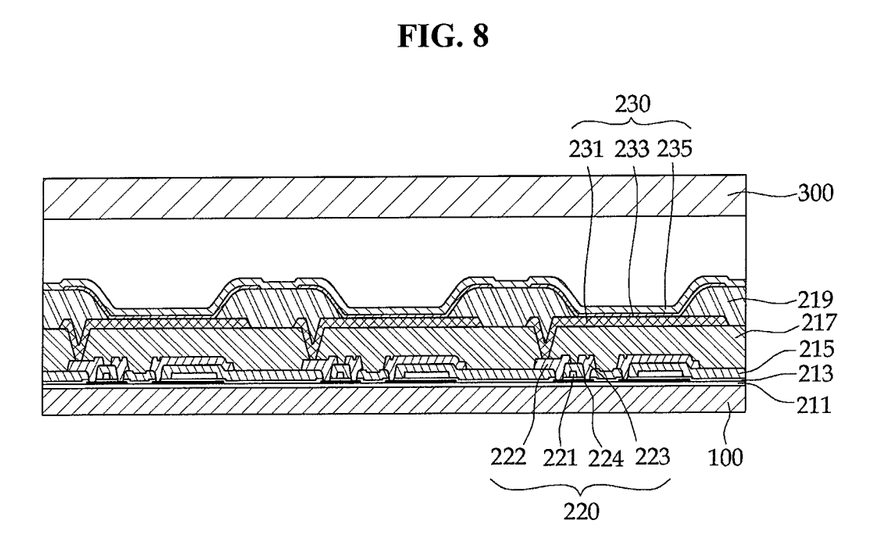
FIG. 8 is a cross-sectional view schematically illustrating a part of an organic light emitting display device according to the exemplary embodiment of the present invention shown in FIG. 2.

FIG. 8 is a cross-sectional view schematically illustrating a part of the organic light emitting display device illustrated in FIG. 2 and illustrates an example of a detailed configuration of the display unit 200.

Referring to FIG. 8, a plurality of thin film transistors 220 are provided on the first substrate 100, and an organic light emitting pixel unit 230 is provided above the thin film transistors 220. The organic light emitting pixel unit 230 in FIG. 8 includes a anode, which is a pixel electrode 231 electrically connected to the thin film transistor 220, a cathode, which is an opposed electrode 235 disposed over the entire surface of the first substrate 100, an emission layer 233 disposed between the electrodes.

The thin film transistor 220 including a gate electrode 221, a drain electrode 222, a source electrode 223, a semiconductor layer 224, a gate insulating layer 213 and an interlayer insulating layer 215 is provided on the first substrate 100.

However, the configuration of the thin film transistor 220 is not limited to the form illustrated in FIG. 8 and may have another form. For example, a bottom gate structure is illustrated in FIG. 8, but unlike this, the thin film transistor 220 may also be formed as a top gate structure. Further, various thin film transistors such as an organic thin film transistor including the semiconductor layer 224 made of an organic material and a silicon thin film transistor including the semiconductor layer 224 made of silicon may also be used. A buffer layer 211 made of silicon oxide, silicon nitride, or the like may be further provided between the thin film transistor 220 and the first substrate 100.

In the organic light emitting pixel unit 230, the anode (i.e., the pixel electrode 231) and the cathode (i.e., the opposed electrode 235) face each other, and the emission layer 233 made of an organic material is interposed between the electrodes. At least one of a hole injection layer or a hole transport layer may be provided between the emission layer and the anode. Also, at least one of an electron injection layer or an electron transport layer may be provided between the emission layer and the cathode.

In FIG. 8, the pixel electrode 231 serves as the anode and the opposed electrode 235 serves as the cathode, but polarities of the pixel electrode 231 and the opposed electrode 235 may also be reversed in other embodiments.

The pixel electrode 231 may be provided as a transparent electrode or a reflective electrode. When provided as the transparent electrode, the pixel electrode 231 may include indium tin oxide (ITO), indium zinc oxide (IZO), zinc oxide (ZnO), or indium(III) oxide ($In_2O_3$). When provided as the reflective electrode, the pixel electrode 231 may include a reflective layer that includes silver (Ag), magnesium (Mg), aluminum (Al), platinum (Pt), palladium (Pd), gold (Au), nickel (Ni), neodymium (Nd), iridium (Ir), chromium (Cr), or a compound thereof and a layer made of ITO, IZO, ZnO or $In_2O_3$ thereon.

The opposed electrode 235 may be provided as a transparent electrode or a reflective electrode. When provided as the transparent electrode, the opposed electrode 235 may include a layer including lithium (Li), calcium (Ca), LiF/Ca, LiF/Al, Al, Mg or a compound thereof and a layer made of a material for forming a transparent electrode such as ITO, IZO, ZnO or $In_2O_3$ thereon. When provided as the reflective electrode, the opposed electrode 235 may be provided by depositing Li, Ca, LiF/Ca, LiF/Al, Al, Mg or a compound thereof.

Meanwhile, a pixel defining layer (PDL) 219 may be provided to cover the edge of the pixel electrode 231 and may cover a portion of the pixel electrode 231. The pixel defining layer 219 serves to define a light emitting region and serves to prevent disconnection between the pixel electrode 231 and the opposed electrode 235 by increasing a gap between an edge of the pixel electrode 231 and the opposed electrode 235 to prevent an electric field from being concentrated at the edge of the pixel electrode 231.

Various layers, including the emission layer 233, are provided between the pixel electrode 231 and the opposed electrode 235. The layers may be made of a low-molecular organic material or a high-molecular organic material.

In the case of using the low-molecular organic material, a hole injection layer (HIL), a hole transport layer (HTL), an emission layer (EML), an electron transport layer (ETL), an electron injection layer (EIL) and the like may be formed to be laminated in a single or complex structure. Organic materials including copper phthalocyanine (CuPc), N,N'-Di(naphthalene-1-yl)-N,N'-diphenyl-benzidine (NPB), tris-8-hydroxyquinoline aluminum (Alq3) and the like may be variously applied. The low-molecular organic material may be formed by methods such as vacuum deposition using masks.

In the case of the high-molecular organic material, the layers may have a structure including a hole transport layer (HTL) and an emission layer (EML), and in this case, PEDOT (Poly(3,4-ethylenedioxythiophene)) may be used as the hole transport layer, and a high-molecular organic material such as poly-phenylenevinylene (PPV) and polyfluorene may be used as the emission layer.

The organic light emitting pixel unit 230 is electrically connected to the thin film transistor 220. In this case, when a planarization layer 217 covering the thin film transistor 220 is provided, the organic light emitting pixel unit 230 is disposed on the planarization layer 217, and the pixel electrode 231 of the organic light emitting pixel unit 230 is electrically connected to the thin film transistor 220 through a contact hole provided in the planarization layer 217.

The organic light emitting pixel unit 230 formed on the first substrate 100 is sealed by the second substrate 300. The second substrate 300 may also be made of various materials, such as, a glass or a plastic material, as described above.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising:
    a first substrate;
    a display unit on the first substrate;
    a second substrate covering the display unit;
    a first sealant adhering the first substrate to the second substrate; and
    a second sealant around the first sealant, the second sealant sealing a gap between the first substrate and the second substrate, the gap being defined by a distance between a top surface of the first substrate and a bottom surface of the second substrate,
    wherein the second sealant comprises a filler, and a particle size of the filler is larger than the gap between the first substrate and the second substrate, and
    wherein each of the first and second sealants completely surrounds the display unit when viewed from a top of a plane, the plane being through the display unit between the first substrate and the second substrate and parallel to the top surface of the first substrate and the bottom surface of the second substrate.

2. The organic light emitting display device of claim 1, wherein a ratio of the particle size of the filler to the gap is from about 1.2 to about 5.0.

3. The organic light emitting display device of claim 1, wherein the filler is around the gap and is configured to block oxygen or moisture from entering the gap.

4. The organic light emitting display device of claim 1, wherein the filler comprises particles having any one of round, plate, or cylindrical shapes.

5. The organic light emitting display device of claim 1, wherein the first sealant is inside an edge of the first substrate or the second substrate and borders the edge of the first substrate or the second substrate between the first substrate and the second substrate.

6. The organic light emitting display device of claim 1, wherein the second sealant extends toward an outside of at least one of the first substrate or the second substrate.

7. The organic light emitting display device of claim 1, wherein
the second substrate is smaller than the first substrate,
the first sealant is inside an edge of the second substrate and borders the edge of the second substrate between the first substrate and the second substrate, and
the second sealant is around the first sealant and extends toward an outside of the second substrate.

8. The organic light emitting display device of claim 7, wherein the second sealant covers at least a portion of a top surface of the second substrate that faces away from and is parallel to the top surface of the first substrate that the display unit is on.

9. The organic light emitting display device of claim 1, wherein
the first substrate is smaller than the second substrate,
the first sealant is inside an edge of the first substrate and borders the edge of the first substrate between the first substrate and the second substrate, and
the second sealant is outside the first sealant and extends toward an outside of the first substrate.

10. The organic light emitting display device of claim 1, wherein a thin film transistor of the display unit is on the first substrate.

11. The organic light emitting display device of claim 1, wherein the second substrate comprises an encapsulation substrate.

12. The organic light emitting display device of claim 1, wherein at least one of the first substrate or the second substrate comprises a glass substrate.

13. The organic light emitting display device of claim 1, wherein the filler comprises from about 50 percent by weight to about 90 percent by weight of the second sealant, with respect to an entire weight of the second sealant.

14. The organic light emitting display device of claim 1, wherein the first sealant comprises another filler.

15. The organic light emitting display device of claim 1, wherein the second sealant covers a portion of a top surface of the second substrate.

16. An organic light emitting display device, comprising:
a first substrate;
a display unit on the first substrate;
a second substrate covering the display unit;
a first sealant comprising a first filler and adhering the first substrate to the second substrate; and
a second sealant around the first sealant, the second sealant sealing a gap between the first substrate and the second substrate, the gap being defined by a distance between a top surface of the first substrate and a bottom surface of the second substrate,
wherein the second sealant comprises a second filler, and a particle size of the second filler is larger than the gap between the first substrate and the second substrate, and
wherein each of the first and second sealants completely surrounds the display unit when viewed from a top of a plane, the plane being through the display unit between the first substrate and the second substrate and parallel to the top surface of the first substrate and the bottom surface of the second substrate.

17. The organic light emitting display device of claim 16, wherein the first filler has a lower coefficient of thermal expansion than a coefficient of thermal expansion of the first sealant.

* * * * *